US009245468B2

(12) United States Patent
Lee et al.

(10) Patent No.: US 9,245,468 B2
(45) Date of Patent: Jan. 26, 2016

(54) DISPLAY DEVICE

(75) Inventors: Jae-Seob Lee, Yongin (KR); Chang-Yong Jeong, Yongin (KR); Yong-Hwan Park, Yongin (KR); Kyung-Mi Kwon, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 266 days.

(21) Appl. No.: 13/431,869

(22) Filed: Mar. 27, 2012

(65) Prior Publication Data

US 2013/0092937 A1 Apr. 18, 2013

(30) Foreign Application Priority Data

Oct. 14, 2011 (KR) ........................ 10-2011-0105427

(51) Int. Cl.

*H01L 23/58* (2006.01)
*H01L 29/10* (2006.01)
*H01L 31/00* (2006.01)
*H01L 27/14* (2006.01)
*G06F 3/038* (2013.01)
*G09G 3/00* (2006.01)

(52) U.S. Cl.

CPC ........ *G09G 3/006* (2013.01); *G09G 2300/0413* (2013.01); *G09G 2330/12* (2013.01)

(58) Field of Classification Search

CPC ........................... G02F 1/1309; G02F 1/13452
See application file for complete search history.

(56) References Cited

U.S. PATENT DOCUMENTS 5,671,026 A 9/1997 Shiraki et al.
6,392,622 B1 5/2002 Ozawa
6,788,507 B2 * 9/2004 Chen et al. ...................... 361/56
8,563,982 B2 * 10/2013 Nakamura ........ G02F 1/133345 257/72
2002/0079920 A1 * 6/2002 Fujikawa .............. G02F 1/1309 324/754.07
2006/0238450 A1 * 10/2006 Onodera ......................... 345/60
2007/0178614 A1 * 8/2007 Arasawa ................. H01L 22/32 438/17
2007/0262383 A1 * 11/2007 Ohkubo et al. ............... 257/350
2008/0111803 A1 * 5/2008 Lee et al. ...................... 345/205
2009/0153173 A1 * 6/2009 Arasawa et al. .............. 324/763
2010/0253656 A1 * 10/2010 Fujikawa .............. G02F 1/1339 345/204
2011/0140110 A1 * 6/2011 Fujikawa ............ H01L 27/1229 257/57
2013/0187842 A1 * 7/2013 Oke .................. G02F 1/134363 345/92

FOREIGN PATENT DOCUMENTS

CN 1117178 A 2/1996
CN 1256763 A 6/2000
CN 102053437 A 5/2011
KR 10-0264236 B1 5/2000

(Continued)

OTHER PUBLICATIONS

English Abstract of CN 102053437 A (1 page).

(Continued)

*Primary Examiner* — Mark Tornow
*Assistant Examiner* — Priya Rampersaud
(74) *Attorney, Agent, or Firm* — Christie, Parker & Hale, LLP

(57) ABSTRACT

A display device according to an exemplary embodiment of the present invention includes a display portion including a plurality of display pixels displaying an image and a dummy portion including a plurality of dummy pixels formed in a periphery region of the display portion. An electrostatic test element group (TEG) may be formed in at least one of the dummy pixels.

11 Claims, 11 Drawing Sheets

(56) References Cited

FOREIGN PATENT DOCUMENTS

| | | | |
|---|---|---|---|
| KR | 10-2001-0058156 | A | 7/2001 |
| KR | 10-2002-0012752 | A | 2/2002 |
| KR | 10-0502792 | B1 | 7/2005 |
| KR | 10-2006-0083261 | A | 7/2006 |
| KR | 10-2008-0062881 | A | 7/2008 |

OTHER PUBLICATIONS

English Abstract of CN 1117178 A (1 page).
English Abstract of CN 1256763 A (2 pages).
SIPO Office Action dated Oct. 10, 2015 for corresponding CN Application No. 201210093381.3 (8 pages).

* cited by examiner

400

DISPLAY DEVICE

CROSS-REFERENCE TO RELATED APPLICATION

This application claims priority to and the benefit of Korean Patent Application No. 10-2011-0105427, filed in the Korean Intellectual Property Office on Oct. 14, 2011, the entire content of which is incorporated herein by reference.

BACKGROUND

1. Field

The following description relates to a display device. More particularly, the following description relates to a display device displaying an image.

2. Description of Related Art

A process for manufacturing a display device requires measurement of thickness, resistance, density, degree of contamination, threshold value, and electric characteristic of a processed element resulting from each process to determine whether each process produces a desired result. However, the measurement process may damage the processed element and thus substantial elements on a substrate should not be a target of monitoring.

In this case, a pattern of a test element group (TEG) is formed in a specific portion of a substrate where test elements are formed or in an additional blank area to perform the same process performed on the substrate where the substantial elements are formed, and then the corresponding process can be evaluated by measuring the TEG.

In order to monitor static electricity generated during the manufacturing process of the display device, a TEG including a transistor is formed in the periphery region of the display device and the transistor is measured to monitor static electricity from transformation of the transistor.

However, the transistor formed in the TEG is an independent transistor and thus it may not accurately represent a plurality of transistors connected with each other in the display area. Accordingly, although the transistor in the TEG is damaged (or deteriorated) due to static electricity, the transistors in the display area may not be damaged (or deteriorated) and can be normally operated so that the transistor in the TEG may not actually represent the transistor in the display area.

As described, the transistor in the TEG is an independent structure, and static electricity generated during a protection film attachment/detachment process, a film scribing process, a laser lift off (LLO) process, and a module process of a flexible display device may not be properly monitored using the transistor in the TEG.

The above information disclosed in this Background section is only for enhancement of understanding of the background of the invention and therefore it may contain information that does not form the prior art that is already known in this country to a person of ordinary skill in the art.

SUMMARY

An aspect of an embodiment of the present invention is directed toward an effort to provide a display device that can reinforce monitoring of static electricity generated during a process.

A display device according to an exemplary embodiment of the present invention includes a display portion including a plurality of display pixels displaying an image and a dummy portion including a plurality of dummy pixels formed in a periphery region of the display portion. An electrostatic test element group (TEG) may be formed in at least one of the dummy pixels.

The electrostatic TEG may include a plurality of electrostatic transistors.

Static source electrodes of the plurality of electrostatic transistors may be connected with each other through a source connection portion.

Static drain electrodes of the plurality of electrostatic transistors may be connected with each other through a drain connection portion.

At least one of the electrostatic transistors may include a static gate pad connected to a static gate electrode of the one electrostatic transistor, a static source pad connected to the static source electrode of the one electrostatic transistor, and a static drain pad connected to the static drain electrode of the one electrostatic transistor. In addition, the static gate pad, the static source pad, and the static drain pad may be disposed on a same line.

The display device may further include a single guard ring surrounding each of the electrostatic transistors.

The width of the single guard ring may be 40 μm to 200 μm.

The single guard ring may be formed of the same material as a corresponding one of the static gate electrodes or the static drain electrodes.

The display device may further include an integrated guard ring surrounding the electrostatic TEG.

The width of the integrated guard ring may be 40 μm to 200 μm.

The integrated guard ring may be formed of the same material as the static gate electrodes or the static drain electrodes.

A plurality of electrostatic TEGs may be formed adjacent to each other at four corners of the display portion.

A plurality of electrostatic TEGs may be formed along the edge of the display portion.

The display device according to an exemplary embodiment of the present invention forms the electrostatic TEG in the dummy pixel formed in the periphery region of the display portion to make variation of the electrostatic transistor of the electrostatic TEG represent variation of the transistor in the display portion to thereby reinforce monitoring of static electricity generated during a process (e.g., a manufacturing process).

Further, in an exemplary embodiment of the present invention, a failure of the display device due to the static electricity can be accurately monitored to thereby improve the process.

DETAILED DESCRIPTION

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Figure 1:
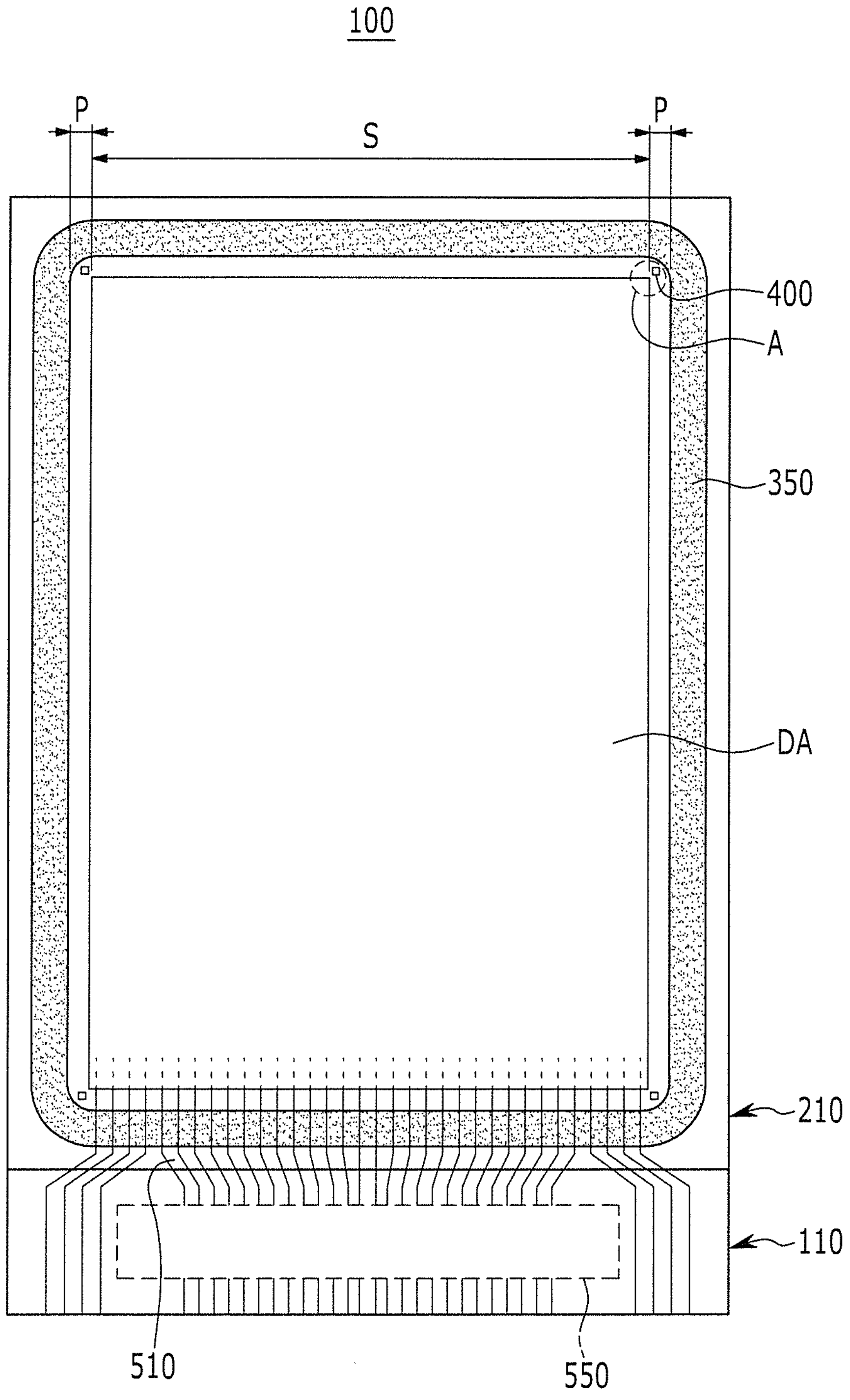
FIG. 1 is a top plan view of a display device according to a first exemplary embodiment of the present invention.
Figure 2:
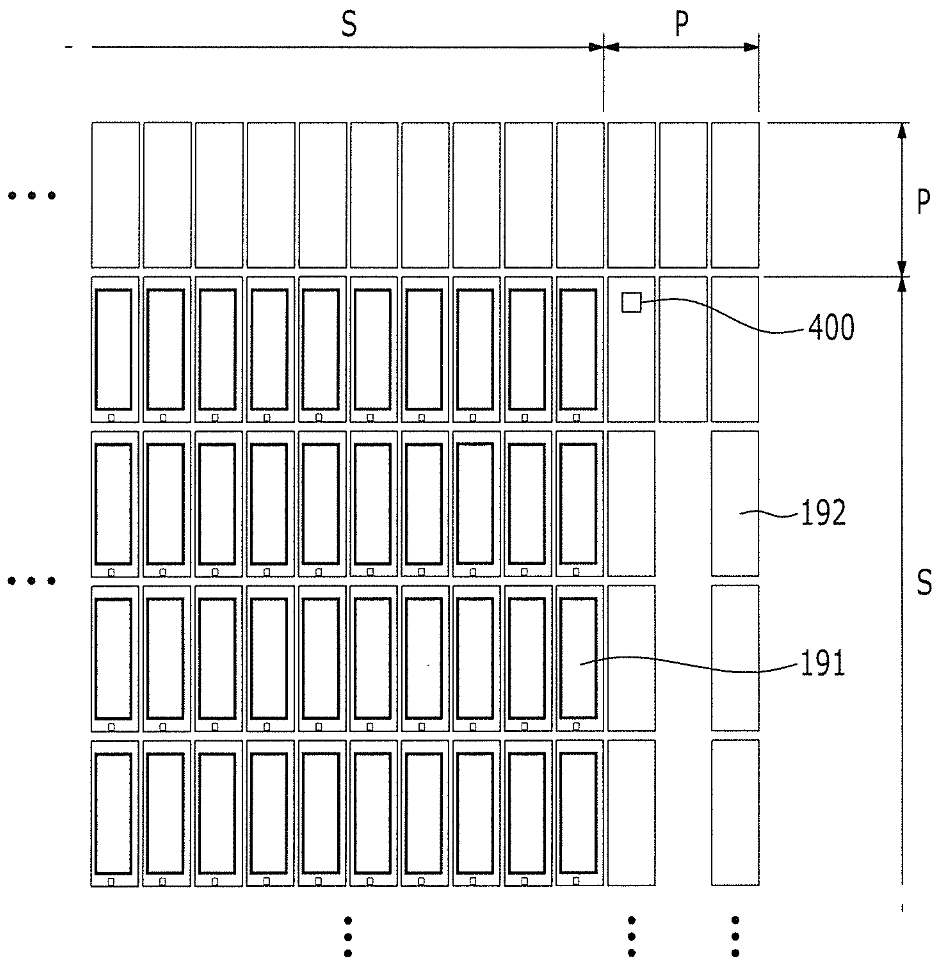
FIG. 2 is an enlarged view of the portion A in FIG. 1.

FIG. 1 is a top plan view of a display device 100 according to a first exemplary embodiment of the present invention, and FIG. 2 is an enlarged view of a portion A of FIG. 1.

As shown in FIG. 1, the display device 100 according to the first exemplary embodiment of the present invention includes a display substrate 110, a sealing member 210 covering the display substrate 110, and a sealant 350 disposed between the display substrate 110 and the sealing member 210.

The sealant 350 is disposed along an edge of the sealing member 210, and sealant 350 seals the display substrate 110 and the sealing member 210 to each other in an air-tight manner. Hereinafter, an inner area between the display substrate 110 and the sealing member 210 surrounded by the sealant 350 is called a display area DA. A plurality of display pixels are formed in the display area DA to display an image.

The sealing member 210 is formed smaller then the display substrate 110 in size. In addition, a driving circuit chip 550 may be mounted on one side edge of the display substrate 110, not covered by the sealing member 210.

In an edge of the display substrate 110, a plurality of conductive wires 510 electrically connecting elements formed in a sealed space formed by the sealant 350 and the driving circuit chip 550 are formed. Therefore, the conductive wires 510 are partially overlapped with the sealant 350.

As shown in FIG. 1 and FIG. 2, the display area DA in the sealant 350 includes a display portion S including a plurality of display pixels 191 displaying an image and a dummy portion P including a plurality of dummy pixels 192 formed in the periphery region of the display portion S.

Here, a display pixel 191 displays an image, and a dummy pixel 192 is used to relatively improve visibility of the display portion S, repair the display pixel, or prevent display non-uniformity occurred due to a failure in the periphery region during the manufacturing process.

An electrostatic test element group (TEG) 400 is formed in a dummy pixel 192 to monitor static electricity generated during the manufacturing process of the display device. An electrostatic TEG 400 may be formed at each of the four corners of the display portion S. In further detail, the electrostatic TEG 400 may be formed in the dummy pixel 192 of the dummy portion P adjacent to the display portion S at each of the four corners of the display portion S. As described, the effect of the static electricity on the display device can be accurately monitored by forming the electrostatic TEG 400 in the dummy pixel 192 adjacent to one or more of the corner portions where static electricity can be easily generated and collected.

Figure 3:
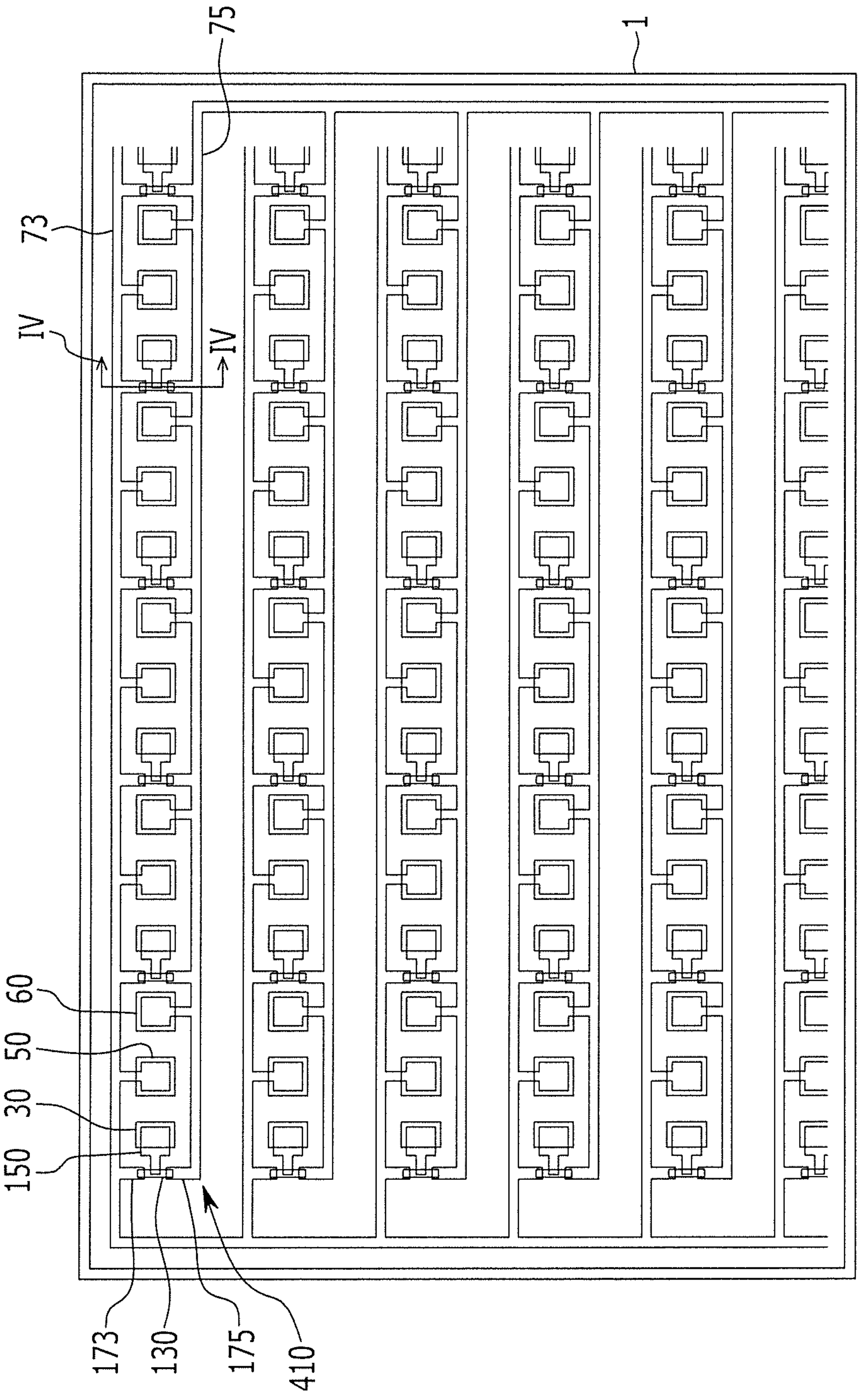
FIG. 3 is a top plan view of an electrostatic TEG formed in a dummy pixel of FIG. 2.
Figure 4:
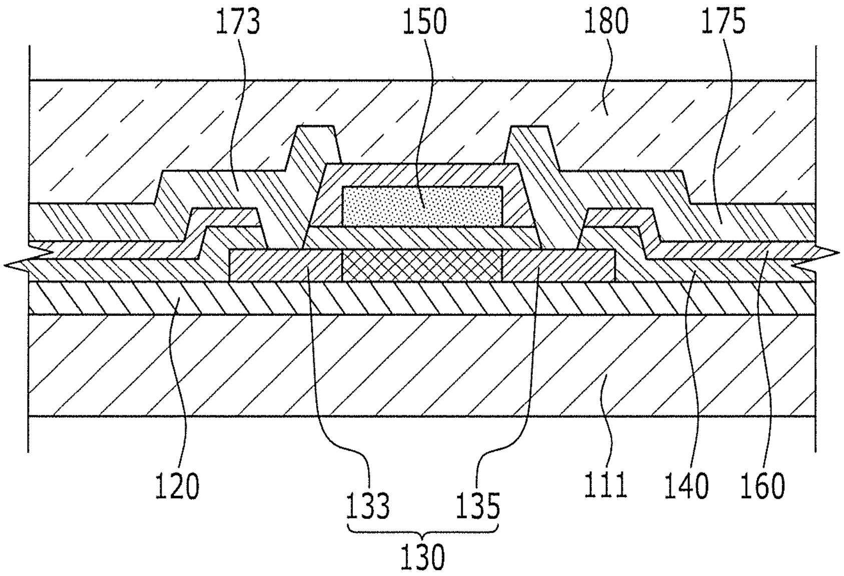
FIG. 4 is a cross-sectional view of FIG. 3, taken along the line IV-IV.

FIG. 3 is a top plan view of an electrostatic TEG 400 formed in a dummy pixel of FIG. 2 and FIG. 4 is a cross-sectional view of FIG. 3, taken along the line IV-IV.

As shown in FIG. 3, the electrostatic TEG 400 includes a plurality of electrostatic transistors 410. The plurality of electrostatic transistors 410 are arranged in a set or predetermined matrix.

One electrostatic transistor 410 includes a static semiconductor layer 130, a static gate electrode 150 partially overlapped with the static semiconductor layer 130 and transmitting a gate signal, a static source electrode 173, and a static drain electrode 175. The static source electrode 173 and the static drain electrode 175 are respectively connected with a source area 133 and a drain area 135 of the static semiconductor layer 130. A data signal is transmitted through the static source electrode 173.

In addition, the electrostatic transistors 410 include a static gate pad 30 connected to the static gate electrode 150, a static source pad 50 connected to the static source electrode 173, and a static drain pad 60 connected to the static drain electrode 175. The static gate pad 30, the static source pad 50, and the static drain pad 60 are formed wide enough to contact a probe inputting an external signal.

Thus, the gate signal is input to the static gate pad 30, and change of the electrostatic transistor 410 due to static electricity in this point can be measured by measuring a data signal flowing to the static source pad 50 and the static drain pad 60.

As described, the change of the static electricity of the display pixel 191 can be accurately measured by forming the electrostatic transistor 410 not in the external periphery region of the sealant 350 but in the dummy pixel 192.

In this case, a static source electrode 173 of one electrostatic transistor 410 is connected with a static source electrode 173 of each of its neighboring electrostatic transistors 410 through a source connection portion 73, and a static drain electrode 175 of one electrostatic transistor 410 is connected with a static drain electrode 175 of each of its neighboring electrostatic transistors 410 through a drain connection portion 75. Thus, the static source electrodes 173 of the plurality of electrostatic transistors 410 are connected with each other, and static drain electrodes 175 are connected with each other.

As described, like the display pixel 191 of which transistors are connected with each other, the dummy pixels 192 are connected with each other through the source connection portion 73 and the drain connection portion 75, and accordingly static electricity change that is equivalent to the static electricity change of the display pixel can be measured (or represented).

In the present exemplary embodiment, both of the source connection portion 73 and the drain connection portion 75 are formed, but the present invention is not thereby limited. For example, only the source connection portion 73 or only the drain connection portion 75 may be formed.

A layering structure of the electrostatic transistors 410 will be described with reference to FIG. 4.

As shown in FIG. 4, a buffer layer 120 is formed on a substrate 111 of the dummy portion P. The static semiconductor layer 130 is formed on the buffer layer 120, and a gate insulation layer 140 is formed on the static semiconductor layer 130 and the buffer layer 120. In addition, the static gate electrode 150 is formed on the gate insulation layer 140, and an interlayer insulation layer 160 is formed on the static gate electrode 150 and the gate insulation layer 140. The static source electrode 173 and the static drain electrode 175 are formed on the interlayer insulation layer 160, and a source area 133 and a drain area 135 of the static semiconductor layer 130 are respectively connected with the static source electrode 173 and the static drain electrode 175 through openings respectively formed in the interlayer insulation layer 160 and the gate insulation layer 140. A protective layer 180 is formed on the static source electrode 173 and the static drain electrode 175.

An integrated guard ring 1 is formed to surround the electrostatic TEG 400 including the plurality of electrostatic transistors 410. The integrated guard ring 1 wholly surrounds the plurality of electrostatic transistors 410, and may be formed of the same material as the static gate electrode 150 or the static drain electrode 175. The integrated guard ring 1 may be formed in the same layer where the static gate electrode 150 or the static drain electrode 175 is formed. Thus, when static electricity is generated, the integrated guard ring 1 absorbs the static electricity together with the electrostatic transistors 410 to reduce the amount of static electricity absorbed to the electrostatic transistors 410, thereby reducing or preventing deterioration of the electrostatic transistors 410. In one embodiment, the integrated guard ring 1 has a width d of 40 μm to 200 μm.

In the first exemplary embodiment, the integrated guard ring 1 is formed to surround the electrostatic TEG, but a single guard ring 2 may be formed to surround a single electrostatic transistor.

Hereafter, a second exemplary embodiment of the present invention will be described with reference to FIG. 5 and FIG. 6.

Figure 5:
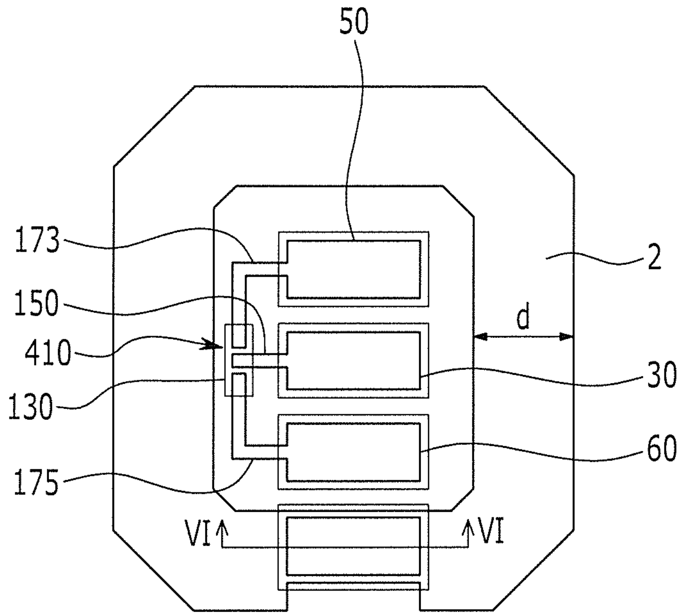
FIG. 5 is a top plan view of an electrostatic TEG of a display device according to a second exemplary embodiment of the present invention.
Figure 6:
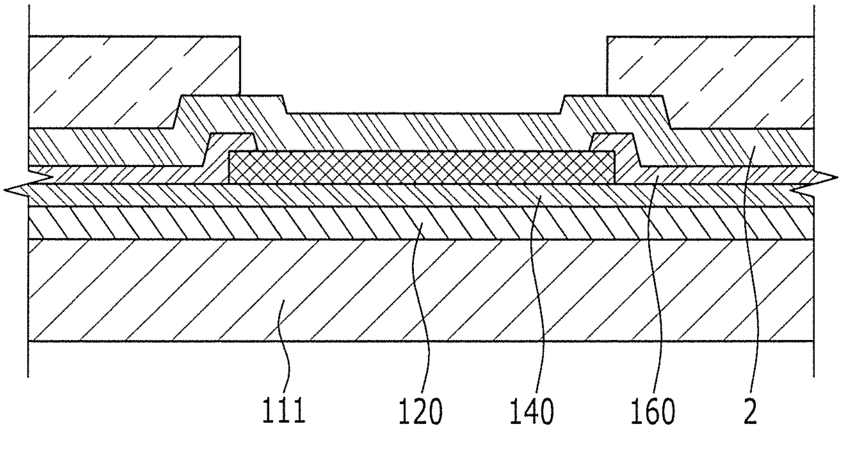
FIG. 6 is a cross-sectional view of FIG. 5, taken along the line VI-VI.

FIG. 5 is a top plan view of an electrostatic TEG of a display device according to the second exemplary embodiment of the present invention, and FIG. 6 is a cross-sectional view of FIG. 5, taken along the line VI-VI.

FIG. 5 and as shown in FIG. 6, an electrostatic transistor 410 of the display device according to the second exemplary embodiment of the present invention includes a static semiconductor layer 130, a static gate electrode 150 partially overlapping the static semiconductor layer 130 and transmitting a gate signal, a static source electrode 173, and a static drain electrode 175. The static source electrode 173 and the static drain electrode 175 are respectively connected with a source area and a drain area of the static semiconductor layer 130. Such an electrostatic transistor 410 includes a static gate pad connected to the static gate electrode 150, a static source pad 50 connected to the static source electrode 173, and a static drain pad 60 connected to the static drain electrode 175. The static gate pad 30, the static source pad 50, and the static drain pad 60 are formed wide enough to contact a probe inputting an external signal. The static gate pad 30, the static source pad 50, and the static drain pad 60 are disposed on the same line.

A single guard ring 2 is formed to surround a single electrostatic transistor 410. The single guard ring 2 may be formed of the same material as the static gate electrode 150 or the static drain electrode 175. In addition, the single guard ring 2 may be formed in the same layer where the static gate electrode 150 or the static drain electrode 175 is formed.

When static electricity is generated, the single guard ring 2 absorbs the static electricity together with the electrostatic transistor 410 to reduce the amount of static electricity absorbed to the electrostatic transistor 410, thereby reducing or preventing deterioration of the electrostatic transistor 410.

In one embodiment, the single guard ring 2 has a width d of 40 μm to 200 μm. That is, in one embodiment, when the width of the single guard ring 2 is smaller than 40 μm, the single guard ring 2 does not absorb enough amount of static electricity, thereby causing the electrostatic transistor 410 to be deteriorated. In another embodiment, when the width of the single guard ring 2 is larger than 200 μm, an area of the single guard ring 2 in the dummy portion P is increased and thus a dead space is increased.

Figure 7:
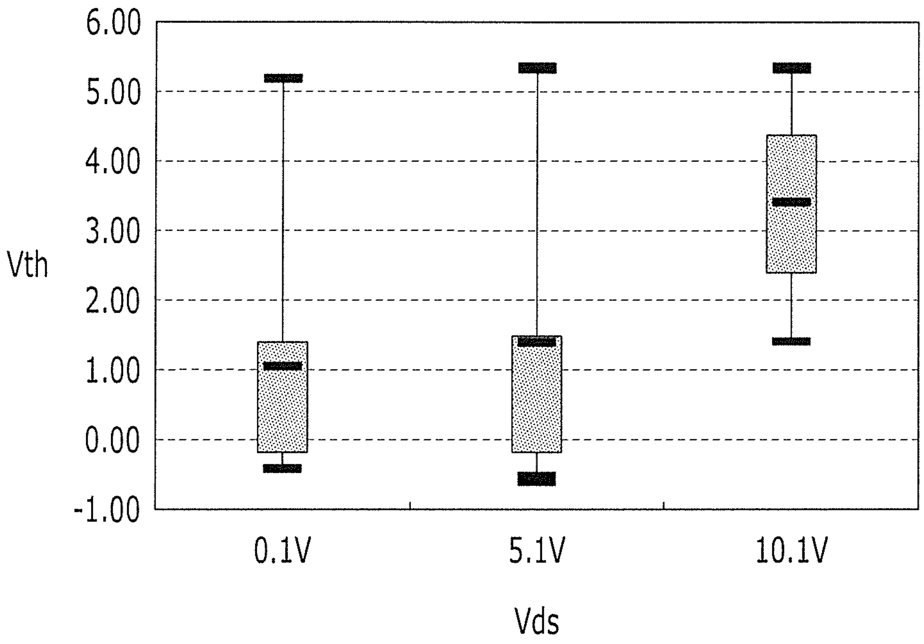
FIG. 7 is a graph illustrating variation of a threshold voltage Vth of electrostatic transistor of a display device having a narrow single guard ring before and after generation of static electricity.
Figure 8:
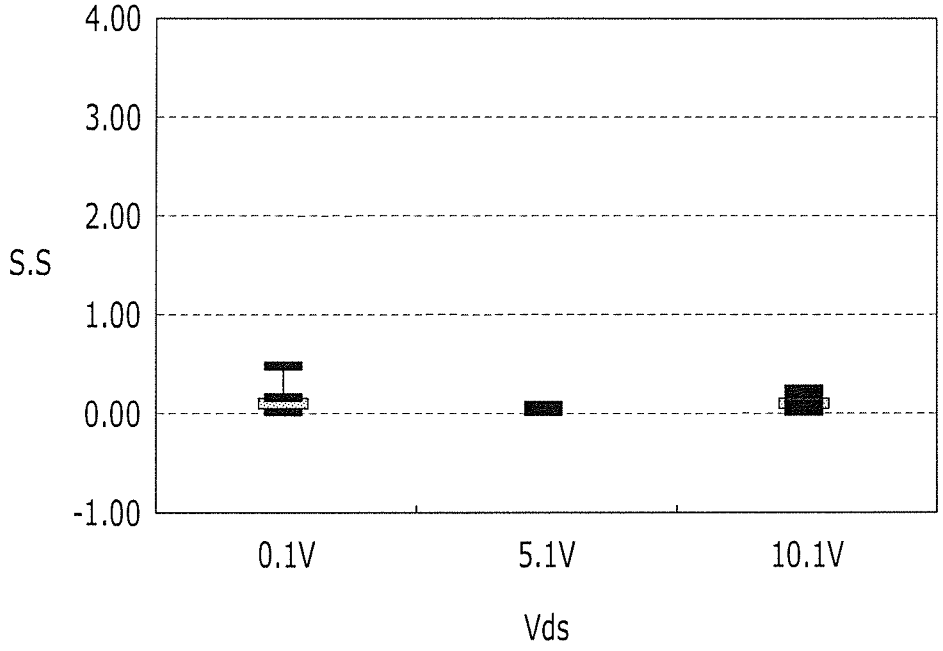
FIG. 8 is a graph illustrating variation of a sub-threshold slope (S.S) of the electrostatic transistor of the display device having the narrow single guard ring before and after generation of static electricity.
Figure 9:
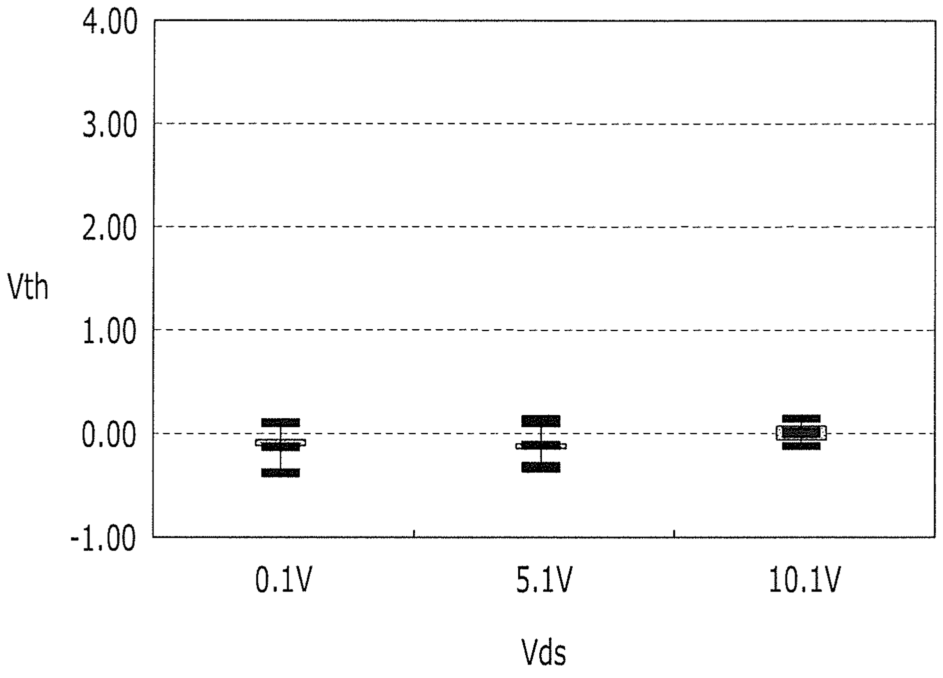
FIG. 9 is a graph illustrating variation of threshold voltage Vth of the electrostatic transistor of the display device according to the second exemplary embodiment of the present invention before and after generation of static electricity.
Figure 10:
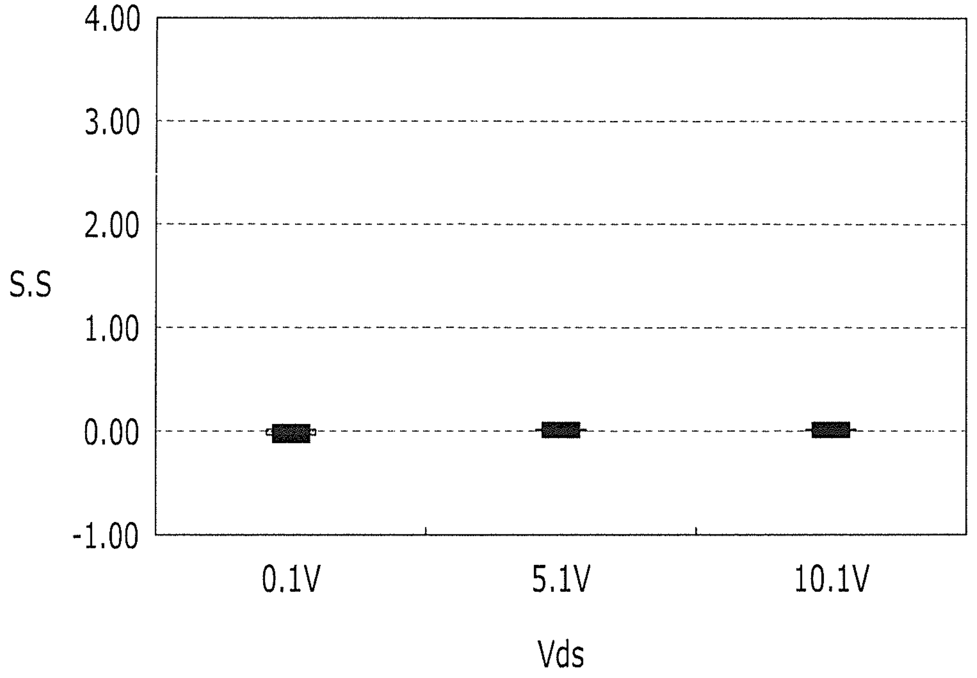
FIG. 10 is a graph illustrating variation of a sub-threshold slope (S.S) of the electrostatic transistor of the display device according to the second exemplary embodiment of the present invention before and after generation of static electricity.

FIG. 7 is a graph illustrating variation of a threshold voltage Vth of electrostatic transistor of a display device having a narrow single guard ring before and after generation of static electricity, FIG. 8 is a graph illustrating variation of a sub threshold slope (S.S) of the electrostatic transistor of the display device having the narrow single guard ring before and after generation of static electricity, FIG. 9 is a graph illustrating variation of threshold voltage Vth of the electrostatic transistor of the display device according to the second exemplary embodiment of the present invention before and after generation of static electricity, and FIG. 10 is a graph illustrating variation of a sub threshold slope (S.S) of the electrostatic transistor of the display device according to the second exemplary embodiment of the present invention before and after generation of static electricity.

FIG. 7 to FIG. 10 are graphs illustrating characteristic change of the electrostatic transistor due to static electricity generated when the transistor of the display device is separated from the substrate.

As shown in FIG. 7 and FIG. 8, when the width of the single guard ring 2 is less than 40 μm and a source-drain voltage difference Vds is 0.1V, 5.1V, and 10.1V, a threshold voltage and a sub-threshold slope (S.S) experience significant change before and after generation of static electricity. Thus, the electrostatic transistors 410 may be easily damaged or deteriorated.

However, as shown in FIG. 9 and FIG. 10, when the width of the single guard ring 2 is 40 μm to 200 μm as in the exemplary embodiment of the present invention, the threshold voltage and the sub-threshold slope (S.S) do not experience any change before and after the generation of static electricity. Therefore, when static electricity is generated in the display device according to the second exemplary embodiment of the present invention, the single guard ring 2 absorbs the static electricity to reduce or prevent deterioration of the electrostatic transistors 410.

In addition, the plurality of electrostatic TEGs are formed in the four corners of the display portion in the first exemplary embodiment, but the present invention is not thereby limited. For example, the plurality of electrostatic TEGs may be formed along the edge of the display portion.

Hereinafter, a third exemplary embodiment of the present invention will be described with reference to FIG. 11.

Figure 11:
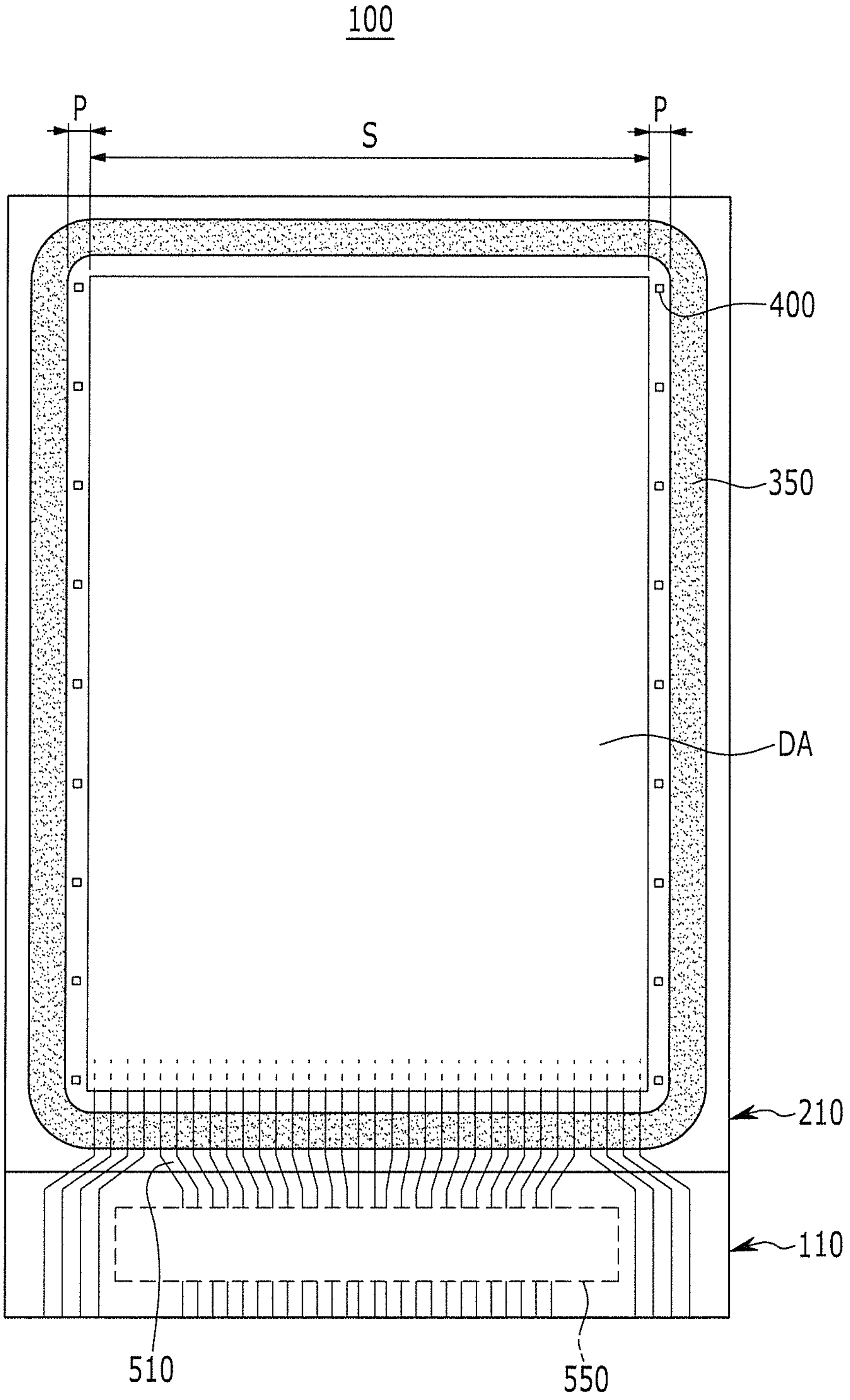
FIG. 11 is a top plan view of a display device according to a third exemplary embodiment of the present invention.

FIG. 11 is a top plan view of a display device according to the third exemplary embodiment of the present invention.

As shown in FIG. 11, a sealant 350 of the display device according to the third exemplary embodiment of the present invention includes display area DA therein. The display area P includes a display portion S including a plurality of display pixels displaying an image and a dummy portion P including a plurality of dummy pixels formed at the periphery region of the display portion S.

A plurality of electrostatic TEGs 400 are formed in the dummy portion P along the edge of the display portion S. The electrostatic TEGs 400 are formed in the dummy pixels of the dummy portion P. As described, the effect of the static electrostatic on the display device can be accurately monitored by forming a large number of electrostatic TEGs 400.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and equivalents thereof.

Description of symbols

| | | | |
|---|---|---|---|
| 1: | Integrated guard ring | 2: | single guard ring |
| 30: | static gate pad | 50: | static source pad |
| 60: | static drain pad | 73: | source connection portion |
| 75: | drain connection portion | 130: | static semiconductor layer |
| 150: | static gate electrode | 173: | static source electrode |
| 175: | static drain electrode | 400: | electrostatic TEG |
| 410: | electrostatic transistor | | |

What is claimed is:

1. A display device comprising:
a display substrate;
a sealing member over the display substrate;
a sealant between the display substrate and the sealing member;
a driving circuit outside of a perimeter of the sealant;
a display portion within the perimeter of the sealant and comprising a plurality of display pixels displaying an image; and
a dummy portion within the perimeter of the sealant and comprising a plurality of dummy pixels in a periphery region of the display portion,
wherein an electrostatic test element group (TEG) is in at least one dummy pixel of the plurality of dummy pixels,
wherein the electrostatic TEG comprises a plurality of electrostatic transistors, and
wherein static source electrodes of the plurality of electrostatic transistors are directly connected with each other through a source connection portion.

2. The display device of claim 1, wherein static drain electrodes of the plurality of electrostatic transistors are connected with each other through a drain connection portion.

3. The display device of claim 2, wherein at least one electrostatic transistor of the plurality of electrostatic transistors comprises a static gate pad connected to a static gate electrode of the at least one electrostatic transistor, a static source pad connected to the static source electrode of the at least one electrostatic transistor, and a static drain pad connected to the static drain electrode of the at least one electrostatic transistor, and wherein the static gate pad, the static source pad, and the static drain pad are disposed on a same line.

4. The display device of claim 3, further comprising a single guard ring surrounding each of the plurality electrostatic transistors.

5. The display device of claim 4, wherein the width of the single guard ring is 40 μm to 200 μm.

6. The display device of claim 5, wherein the single guard ring is formed of the same material as a corresponding one of the static gate electrodes or the static drain electrodes.

7. The display device of claim 3, further comprising an integrated guard ring surrounding the electrostatic TEG.

8. The display device of claim 7, wherein the width of the integrated guard ring is 40 μm to 200 μm.

9. The display device of claim 8, wherein the integrated guard ring is formed of the same material as the static gate electrodes or the static drain electrodes.

10. The display device of claim 1, wherein the electrostatic TEG comprises a plurality of electrostatic TEGs formed adjacent to each other at four corners of the display portion.

11. The display device of claim 1, wherein the electrostatic TEG comprises a plurality of electrostatic TEGs formed along an edge of the display portion.

* * * * *